(12) United States Patent
Hung et al.

(10) Patent No.: US 12,065,731 B2
(45) Date of Patent: Aug. 20, 2024

(54) TUNGSTEN DEPOSITION ON A COBALT SURFACE

(71) Applicant: Taiwan Semiconductor Manufacturing Company, Ltd., Hsinchu (TW)

(72) Inventors: Chi-Cheng Hung, Tainan (TW); Pei-Wen Wu, Hsinchu (TW); Yu-Sheng Wang, Tainan (TW); Pei-Shan Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

(21) Appl. No.: 17/248,358

(22) Filed: Jan. 21, 2021

(65) Prior Publication Data

US 2022/0228257 A1    Jul. 21, 2022

(51) Int. Cl.
| | |
|---|---|
| *H01L 21/033* | (2006.01) |
| *C23C 16/02* | (2006.01) |
| *C23C 16/06* | (2006.01) |
| *H01L 21/02* | (2006.01) |
| *H01L 29/34* | (2006.01) |
| *H01L 29/66* | (2006.01) |

(52) U.S. Cl.
CPC .......... *C23C 16/06* (2013.01); *C23C 16/0281* (2013.01); *H01L 21/02425* (2013.01); *H01L 21/0332* (2013.01); *H01L 29/34* (2013.01); *H01L 29/66795* (2013.01)

(58) Field of Classification Search
CPC ......... H01L 21/76843; H01L 21/28518; H01L 21/76846; H01L 21/28556; H01L 21/76855
See application file for complete search history.

(56) References Cited

U.S. PATENT DOCUMENTS

| | | | |
|---|---|---|---|
| 10,043,708 B2 | 8/2018 | Sardesai et al. | |
| 11,410,880 B2 | 8/2022 | Huang et al. | |
| 2005/0036361 A1* | 2/2005 | Fukuzumi ............... | G11C 11/16 365/158 |
| 2008/0268635 A1 | 10/2008 | Yu et al. | |
| 2009/0053426 A1 | 2/2009 | Lu et al. | |
| 2014/0011354 A1* | 1/2014 | Lei ................... | H01L 21/76864 438/653 |

(Continued)

FOREIGN PATENT DOCUMENTS

| | | |
|---|---|---|
| KR | 20150116075 A | 10/2015 |
| KR | 20200124588 A | 11/2020 |

OTHER PUBLICATIONS

German Office Action issued in German Application No. 10 2021 101 732.7; Dated Sep. 13, 2021, 10 Pages.

*Primary Examiner* — Tony Tran

(74) *Attorney, Agent, or Firm* — Harrity & Harrity, LLP

(57) ABSTRACT

In some implementations, one or more semiconductor processing tools may deposit cobalt material within a cavity of the semiconductor device. The one or more semiconductor processing tools may polish an upper surface of the cobalt material. The one or more semiconductor processing tools may perform a hydrogen soak on the semiconductor device. The one or more semiconductor processing tools may deposit tungsten material onto the upper surface of the cobalt material.

20 Claims, 8 Drawing Sheets

(56) References Cited

U.S. PATENT DOCUMENTS

| | | | |
|---|---|---|---|
| 2015/0287907 A1* | 10/2015 | Park | H01L 43/02 |
| | | | 257/421 |
| 2017/0011354 A1 | 1/2017 | Gross et al. | |
| 2022/0149171 A1* | 5/2022 | Huang | H01L 29/513 |
| 2022/0190102 A1* | 6/2022 | Huang | H01L 23/5222 |

* cited by examiner

TUNGSTEN DEPOSITION ON A COBALT SURFACE

BACKGROUND

For fin field-effect transistor (FinFET) structures, such as a 5 nanometer (nm) node, cobalt material may be used as a contact plug and tungsten material may be disposed on an upper surface of the cobalt material to form a tungsten via of a contact loop. A process for forming the contact loop may include deposition of a titanium-based material into a cavity of a semiconductor device (e.g., a silicon wafer), rapid thermal heat annealing, deposition of cobalt within the cavity of the semiconductor device, planarization of the cobalt, and then deposition of tungsten material for the tungsten via.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
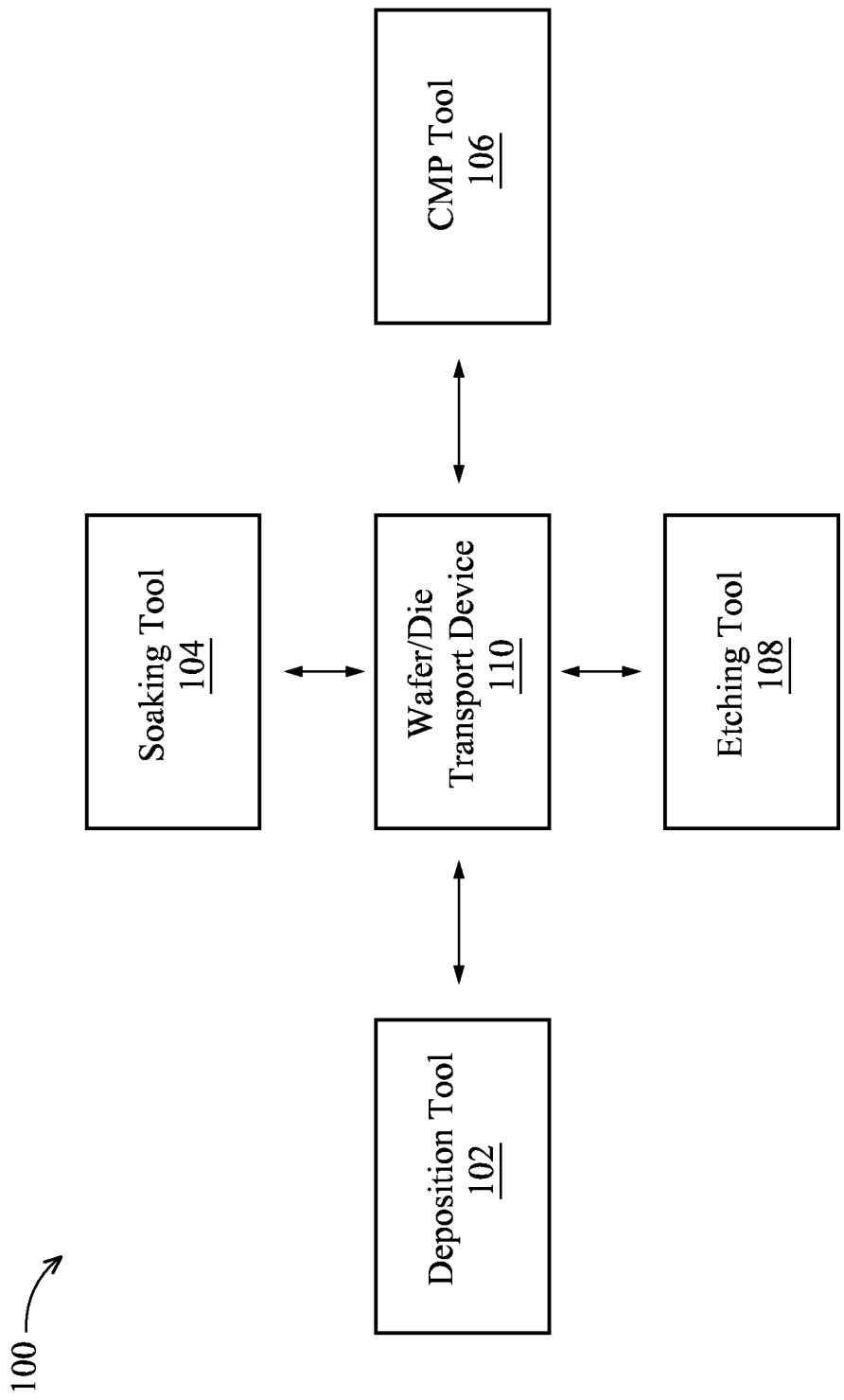
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "outer," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, processes for forming a contact loop may include deposition of a titanium-based material into a cavity of a semiconductor device (e.g., a silicon wafer), rapid thermal heat annealing, depositing cobalt within the cavity of the semiconductor device, planarizing the cobalt, and then depositing tungsten material for the tungsten via. However, this process may result in relatively high resistivity between the tungsten material and the cobalt material based on the tungsten via being nonuniform and/or oxygen or nitrogen bonded to the cobalt material between the cobalt material and the tungsten material.

Some implementations described herein provide techniques and apparatuses for tungsten deposition on a cobalt surface. In some implementations described herein, a process for forming a contact loop may include depositing cobalt material within a cavity of a semiconductor device (e.g., as a contact plug). The process may also include polishing an upper surface of the cobalt material to form a planarized upper surface of the cobalt material. The process may further include performing a hydrogen soak (e.g., with hydrogen gas) before depositing tungsten material (e.g., a tungsten via) onto an upper surface of the cobalt material.

In some implementations, the hydrogen soak may cause greater than 50% (e.g., a majority) of the cobalt material (e.g., greater than 50% of the upper surface of the cobalt material) to be in a hexagonal close-packed (HCP) phase, which may improve contact resistance between the cobalt material and the tungsten material. In some implementations, the contact resistance may be reduced (e.g., to about 375 ohms from about 588 ohms) for a tungsten via in a FinFET structure. In some implementations, the hydrogen soak may prevent or reduce bonding of nitrogen and/or oxygen with the upper surface of the cobalt material. In some implementations, the hydrogen soak may remove nitrogen and/or oxygen from the upper surface of the cobalt material before depositing the tungsten material.

FIG. 1 is a diagram of an example environment 100 in which systems and/or methods described herein may be implemented. As shown in FIG. 1, environment 100 may include a plurality of semiconductor processing tools 102-108 and a wafer/die transport device 110. The plurality of semiconductor processing tools 102-108 may include a deposition tool 102, a soaking tool 104, a chemical-mechanical polishing (CMP) tool 106, an etching tool 108, and/or other the like. The semiconductor processing tools included in example environment 100 may be included in a semiconductor clean room, a semiconductor foundry, a semiconductor processing and/or manufacturing facility, and/or the like.

Deposition tool 102 is a semiconductor processing tool that includes a semiconductor processing chamber and one or more devices capable of depositing various types of materials onto a semiconductor device. For example, deposition tool 102 may include a chemical vapor deposition device (e.g., an electrostatic spray device, an epitaxy device, and/or another type of chemical vapor deposition device), a physical vapor deposition device (e.g., a metal deposition device, a sputtering device, and/or another type of physical vapor deposition device), an atomic layer deposition device, and/or the like. In some implementations, deposition tool 102 may deposit a metal layer onto a source region or a drain region of a semiconductor device, may deposit a contact material to form a contact (e.g., a self-aligned contact) of a semiconductor device, and/or the like as described herein.

Soaking tool 104 is a semiconductor processing tool that includes one or more devices capable of soaking material of a surface of a wafer or a semiconductor device. For example, soaking tool 104 may include a chamber into which a gas may be filled to react with material on a surface of a wafer or displace other gaseous material. In some implementations, soaking tool 104 may include a vacuum pump to remove and/or reduce gaseous material from the chamber, a gas inlet through which desired soaking gas may enter the chamber, and/or the like. In some implementations, the desired soaking gas may react with material on a surface of a wafer or displace other gaseous material from the surface of the wafer or the semiconductor device (e.g., based on relative densities of the soaking gas and the other gaseous material.

CMP tool 106 is a semiconductor processing tool that includes one or more device capable of polishing or planarizing various layers of a wafer or semiconductor device. In some implementations, CMP tool 106 may polish or planarize a layer of deposited or plated material.

Etching tool 108 is a semiconductor processing tool that includes one or more devices capable of etching (e.g., removing) material from a surface of a wafer or a semiconductor device. For example, etching tool 108 may include a wet etching device, a dry etching device, a laser etching device, a chemical etching device, a plasma etching device, a reactive ion etching device, a sputter etching device, a vapor phase etching device, and/or the like. In some implementations, etching tool 108 may remove a layer from a semiconductor device as described herein.

Wafer/die transport device 110 includes a mobile robot, a robot arm, a tram or rail car, and/or another type of device that are used to transport wafers and/or dies between semiconductor processing tools 102-108 and/or to and from other locations such as a wafer rack, a storage room, and/or the like. In some implementations, wafer/die transport device 110 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

FIGS. 2A-2E are diagrams of one or more example implementations 200 described herein. Example implementation(s) 200 may include one or more example implementations of a process for tungsten deposition on a cobalt surface. In some implementations, example implementation(s) may include a process of forming a contact loop within a semiconductor device (e.g., a FinFET device). One or more of example implementation(s) 200 may include depositing cobalt material within a cavity of a semiconductor device, performing a CMP process on an upper surface of the cobalt material, performing a hydrogen soak on the semiconductor device, and depositing tungsten material onto an upper surface of the cobalt material. Based on performing the hydrogen soak on the semiconductor device before depositing the tungsten material, a resistivity between the cobalt material and the tungsten material may be reduced.

Figure 2A:
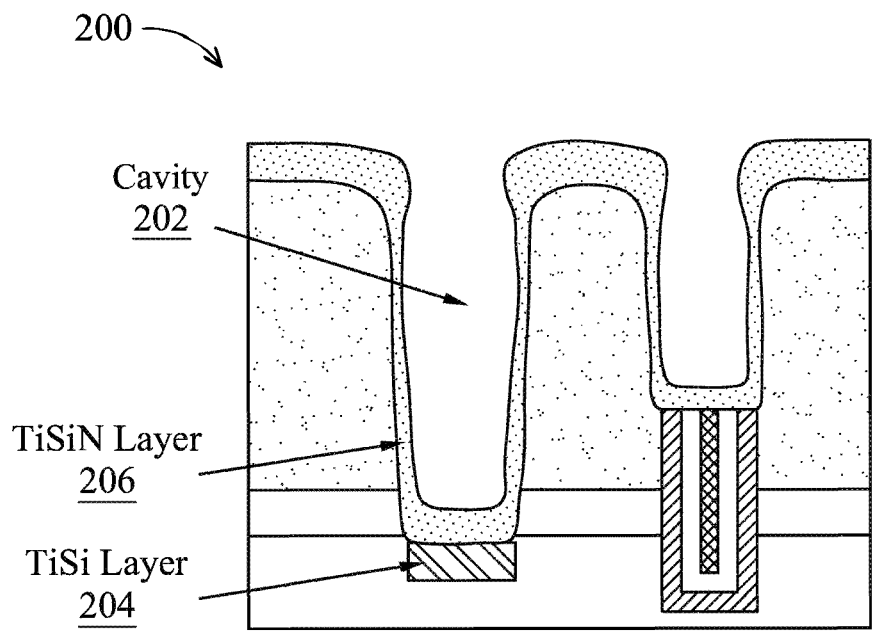
FIGS. 2A-2E are diagrams of one or more example implementations described herein.

As shown in FIG. 2A, a cavity 202 may be formed in a semiconductor device. For example, one or more semiconductor processing tools, such as a deposition tool (e.g., deposition tool 102) and an etching tool (e.g., etching tool 108), may perform one or more deposition operations and one or more etching operations to form the cavity 202. One or more titanium-based layers may be deposited within the cavity 202. For example, a deposition tool (e.g., deposition tool 102) may deposit the one or more titanium-based layers within the cavity 202. The one or more titanium-based layers may include a titanium and silicon layer 204 (e.g., titanium disilicide) and/or a titanium, silicon, and nitrogen layer 206 (e.g., titanium silicon nitride).

Figure 2B:
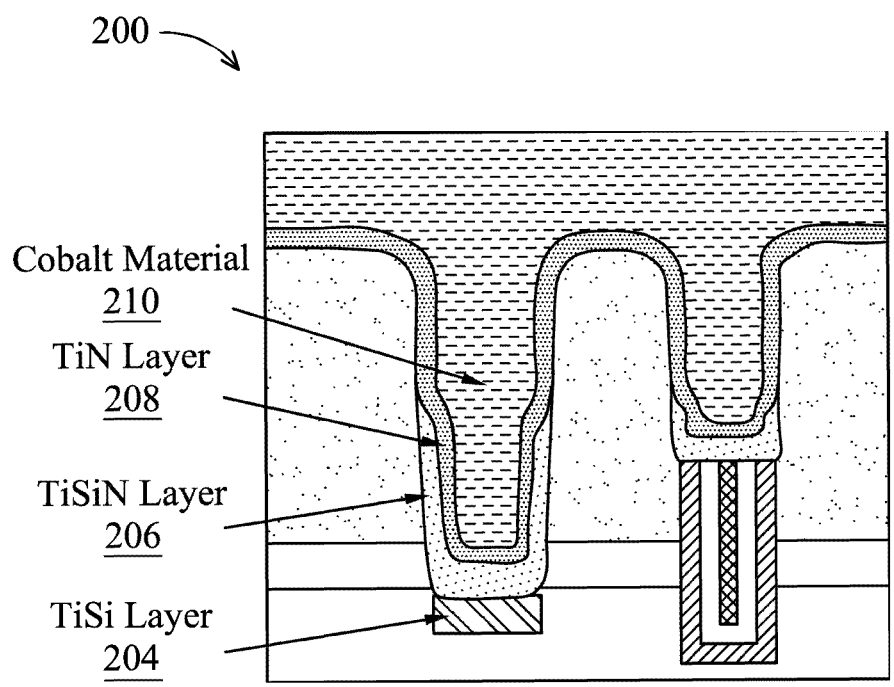

As shown in FIG. 2B, another titanium-based layer, that includes nitrogen (titanium nitride 208), may be deposited within the cavity 202. For example, a deposition tool (e.g., deposition tool 102) may deposit the titanium nitride 208 onto an upper surface (e.g., an outer surface) of the one or more titanium-based layers within the cavity 202. The titanium nitride 208 and/or the one or more titanium-based layers may adhere the cobalt material 210 within the cavity 202.

As further shown in FIG. 2B, the cavity 202 may be filled with cobalt material 210. For example, a deposition tool (e.g., deposition tool 102) may deposit the cobalt material 210 onto an upper surface (e.g., an outer surface) of the titanium nitride 208 (e.g., both within and outside of the cavity 202 as shown in FIG. 2B). In some implementations, the deposition tool may use a metal deposition process to deposit the cobalt material 210. In some implementations, one or more semiconductor processing tools may perform a rapid thermal anneal (RTA) process on the semiconductor device before, and/or as part of, deposition of the cobalt material 210.

Figure 2C:
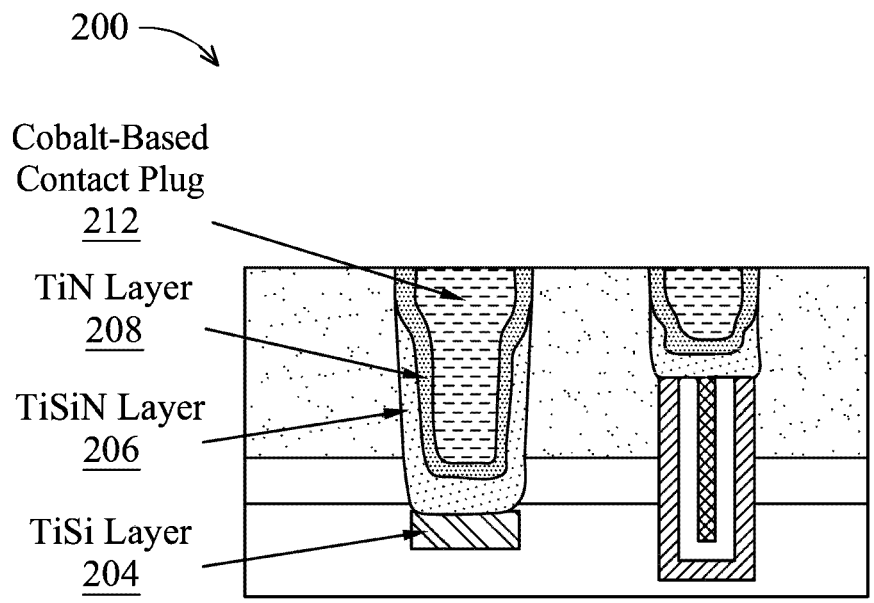

As shown by FIG. 2C, an upper surface of the cobalt material 210 may be planarized and/or polished to form a cobalt-based contact plug 212. For example, a CMP tool (e.g., CMP tool 106) may planarize and/or polish the upper surface of the cobalt material 210 to form the cobalt-based contact plug 212. In some implementations, the CMP tool may remove a portion of the cobalt material 210 and/or material of one or more of the titanium-based layers that is disposed outside of the cavity 202. In some implementations, the upper surface of the cobalt-based contact plug 212 may be coplanar with an upper surface of the semiconductor device outside of the cavity 202.

Figure 2D:
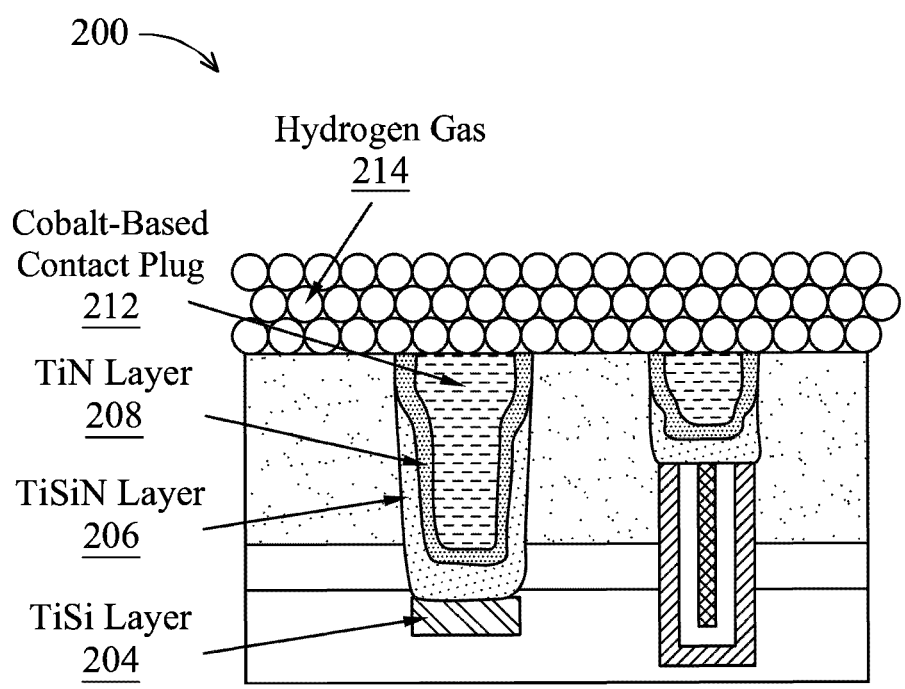

As shown by FIG. 2D, the semiconductor device may be subjected to a hydrogen soak. For example, a soaking tool (e.g., soaking tool 104) may perform a hydrogen soak on the semiconductor device (e.g., at approximately 20-22 degrees Celsius, at below than 20 degrees Celcius, at above 22 degrees Celsius, or at above 50 degrees Celsius). In some implementations, when performing the hydrogen soak, the soaking tool may apply hydrogen gas 214 to the semiconductor device (e.g., in a chamber) before depositing tungsten material. The soaking tool may apply the hydrogen gas 214 for at least 3 minutes (180 seconds) to prevent and/or reduce bonding of the upper surface of the cobalt-based contact plug 212 with nitrogen and/or oxygen and/or to remove impurities from the upper surface of the cobalt-based contact plug 212. In some implementations, the soaking tool may apply the hydrogen gas 214 for a different amount of time, such as at least 1 minute (60 seconds), at least 2 minutes (120 seconds), or at least 4 minutes (240 seconds), among other examples.

In some implementations, the soaking tool may perform the hydrogen soak immediately after planarizing and/or polishing the upper surface of the cobalt material 210. In this way, the hydrogen soak may prevent and/or reduce bonding of the upper surface of the cobalt-based contact plug 212 with nitrogen and/or oxygen. For example, cobalt oxide may be reduced by hydrogen gas 214 (e.g., $H_2$) to metallic cobalt. In some implementations, the soaking tool may perform the hydrogen soak immediately before depositing tungsten on the upper surface of the cobalt-based contact plug 212. In this way, the hydrogen soak may remove impurities from the upper surface of the cobalt-based contact plug 212. For example, the hydrogen may bond with, and/or remove, nitrogen and/or oxygen that has bonded with the upper surface of the cobalt-based contact plug 212.

In some implementations, performing the hydrogen soak may induce an increased amount of HCP phase cobalt, which may improve uniformity on the upper surface of the cobalt-based contact plug 212. With an improved uniformity, the upper surface may form an improved electrical connection (e.g., with reduced resistivity) with tungsten material deposited on the upper surface. In prior processes (e.g., without the hydrogen soak), a cobalt-based contact plug may have greater than 50% (e.g., about 67%) of the cobalt-based contact plug 212 in a face centered cubic (FCC) phase. However, based on performing the hydrogen soak, a cobalt-based contact plug may have greater than 50% of the cobalt-based contact plug 212 in an HCP phase. For example, the cobalt-based contact plug 212 may have at least 55% in the HCP phase (e.g., a ratio of HCP:FCC of 55%:45%) or about 59% in the HCP phase (e.g., a ratio of HCP:FCC of 59%:41%), or about 65% in the HCP phase (e.g., a ratio of HCP:FCC of 65%:35%), among other examples.

Figure 2E:
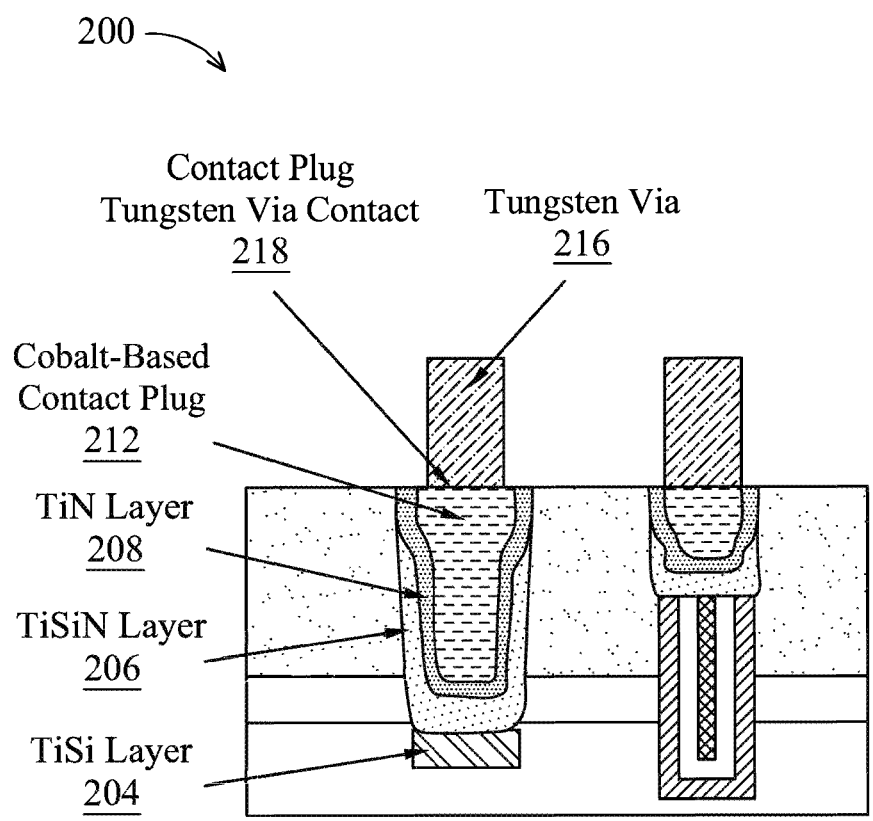

As shown in FIG. 2E, a tungsten via 216 may be deposited onto the upper surface of the cobalt-based contact plug 212. For example, a deposition tool (e.g., deposition tool 102) may deposit the tungsten via 216 onto the upper surface of the cobalt-based contact plug 212. In some implementations, the tungsten via 216 and the cobalt-based contact plug 212 may interface at a contact plug tungsten via contact 218. In some implementations, the deposition tool may deposit the tungsten via 216 using a vapor deposition process. In some implementations, the deposition tool may deposit the tungsten via 216 after performance of one or more deposition and/or etching operations (e.g., by etching tool 108) to form a cavity into which the deposition tool may deposit tungsten material to form the tungsten via. In some implementations, the etching tool may etch additional materials used to form the cavity, such as a photoresist layer, a mask, a nitride layer, and/or an oxide layer, among other examples. In some implementations, based on performing the hydrogen soak before depositing the tungsten via 216, a resistivity between the cobalt-based contact plug 212 (e.g., at the contact plug tungsten via contact 218) and the tungsten via 216 may be less than about 375 ohms, and in some cases less than about 170 ohms, which may reduce an amount of a voltage drop across the tungsten via 216 and the cobalt-based contact plug 212 and/or reduce an amount of power consumed when operating the semiconductor device. In some implementations, the resistivity between the cobalt-based contact plug 212 and the tungsten via 216 may be a different amount of resistance, such as less than 400 ohms, less than about 300 ohms, or less than about 200 ohms, among other examples. In other words, based on performing the hydrogen soak on the semiconductor device before depositing the tungsten material, a resistivity between the cobalt material and the tungsten material may be reduced (e.g., by about half or by more than half, among other examples).

The number and arrangement of structures, layers, and/or the like shown in FIGS. 2A-2E are provided as an example.

In practice, a semiconductor device including additional structures and/or layers, fewer structures and/or layers, different structures and/or layers, or differently arranged structures and/or layers than those shown in FIGS. 2A-2E may be processed according to the techniques described above in connection with FIGS. 2A-2E.

Figure 3:
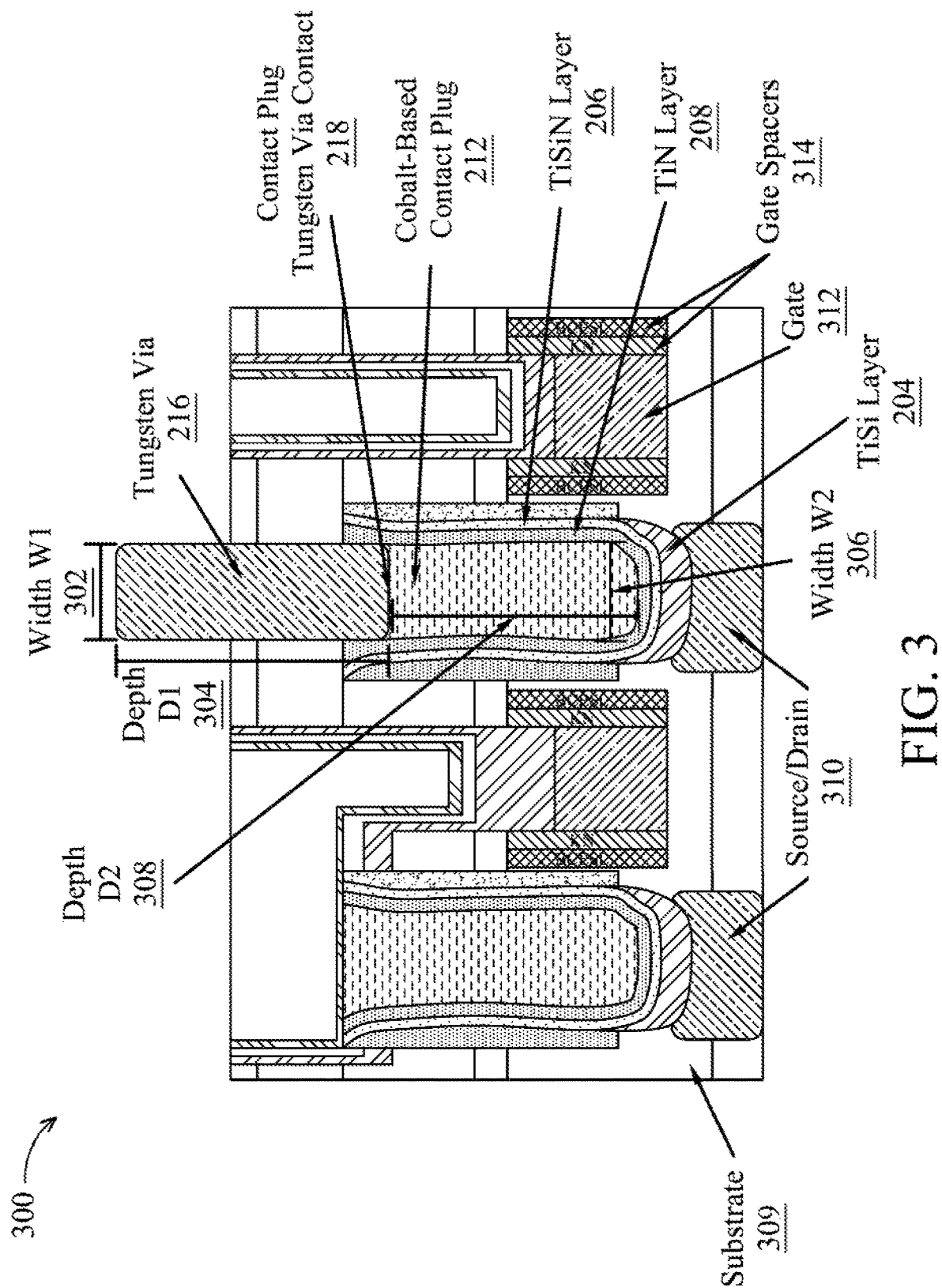
FIG. 3 is a diagram of an example semiconductor device formed based on the example techniques described in connection with FIGS. 2A-2E.

FIG. 3 is a diagram of a semiconductor device 300 (e.g., a FinFET) formed based on the example techniques described in connection with FIGS. 2A-2E. In some implementations, the semiconductor device 300 may include a FinFET structure, such as a 5 nm node, with a cobalt-based contact plug 212 and a tungsten via 216 that interface at a contact plug tungsten via contact 218. The cobalt-based contact plug 212 may be disposed within a cavity of the semiconductor device 300 on an upper surface (e.g., an outer surface) of a layer of titanium-based material within the cavity. In other words, the layer of titanium-based material may be disposed within the cavity and on a lower surface of the cobalt-based contact plug 212.

In some implementations, the layer of titanium-based material may include one or more sub-layers of titanium-based material. For example, the layer of titanium-based material may include a sublayer of material including titanium and silicon (e.g., TiSi layer 204), a sublayer of material including titanium, silicon, and nitrogen (TiSiN layer 206), and/or a sublayer of material including titanium and nitrogen (TiN layer 208), among other examples.

In some implementations, the TiSi layer 204 may have a thickness in a range from approximately 4 nanometers to approximately 8 nanometers. In some implementations, the TiSiN layer 206 may have a thickness in a range from approximately 7 angstroms to approximately 15 angstroms. In some implementations, the TiN layer 208 may have a thickness in a range from approximately 5 angstroms to approximately 15 angstroms.

The tungsten via may have a width W1 302 and a depth D1 304. In some implementations, the width W1 302 may be in a range from approximately 11 nanometers to approximately 17 nanometers. In some implementations, the depth D1 304 may be in a range from approximately 12 nanometers to approximately 35 nanometers.

In some implementations, the cobalt-based contact plug may have a width W2 306 and a depth D2 308. In some implementations, the width W2 306 may be in a range from approximately 10 nanometers to approximately 20 nanometers. In some implementations, the depth D2 308 may be in a range from approximately 35 nanometers to approximately 50 nanometers.

In some implementations, the semiconductor device 300 may include a substrate 309 (e.g., a silicon-based substrate), one or more source/drains 310 (e.g., source regions and/or drain regions), one or more gates 312, and/or one or more gate spacers 314. The gate spacers and/or an insulating cap (e.g., a dielectric material) may electrically insulate the one or more gates 312 from the tungsten via 216 and/or one or more additional contacts of the semiconductor device 300. Additionally, or alternatively, an interlayer dielectric material may electrically insulate the one or more gates 312 from the tungsten via 216.

As indicated above, FIG. 3 is provided as an example. Other examples may differ from what is described with regard to FIG. 3.

Figure 4:
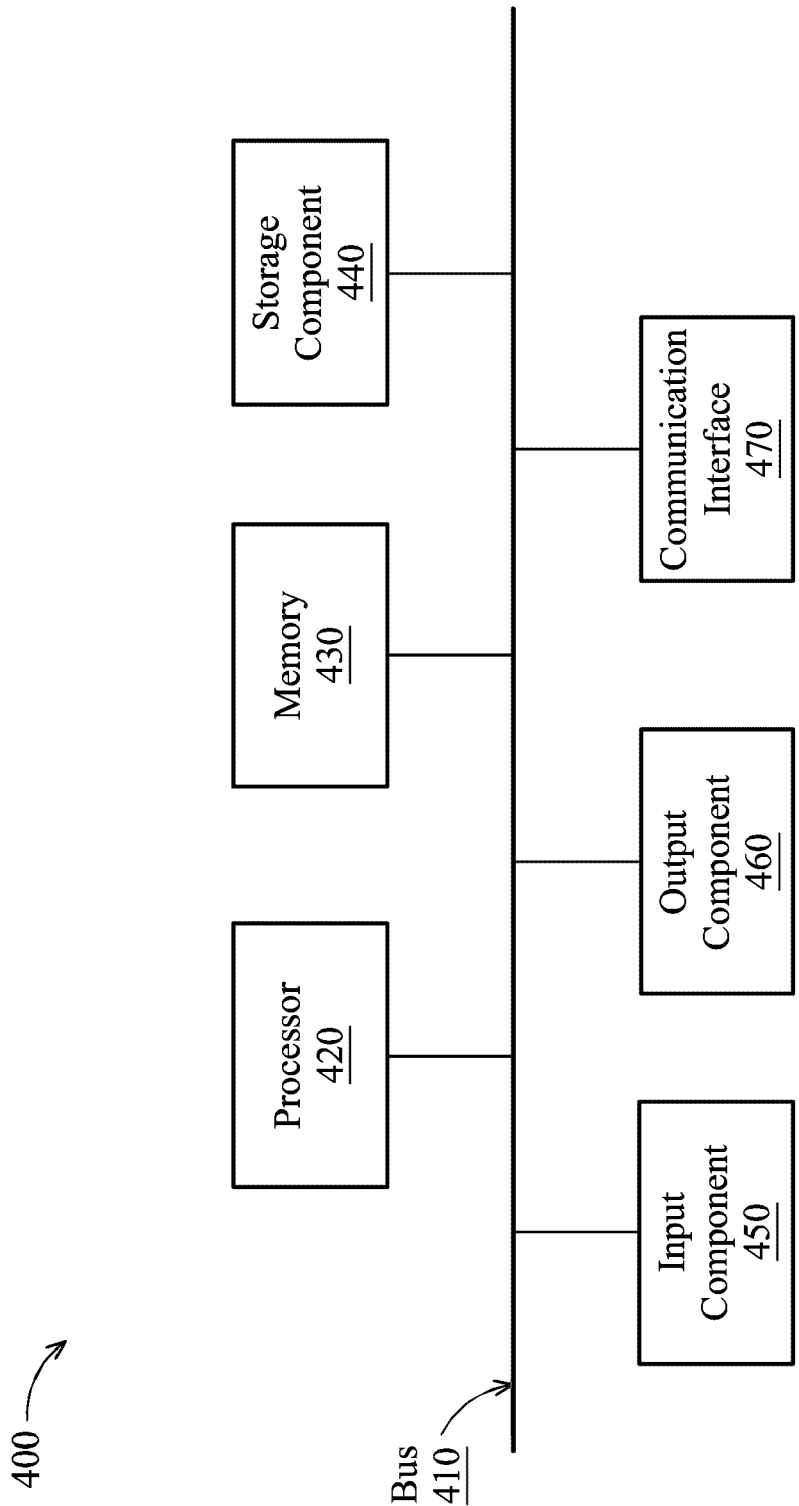
FIG. 4 is a diagram of example components of one or more devices of FIG. 1.

FIG. 4 is a diagram of example components of a device 400. In some implementations, deposition tool 102, soaking tool 104, CMP tool 106, etching tool 108, and/or wafer/die transport device 110 may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, an actuator, and/or the like. Output component 460 enables device 400 to provide output, such as via a display, a speaker, and/or one or more light-emitting diodes. Communication interface 470 enables device 400 to communicate with other devices, such as via a wired connection and/or a wireless connection. For example, communication interface 470 may include a receiver, a transmitter, a transceiver, a modem, a network interface card, an antenna, and/or the like.

Device 400 may perform one or more processes described herein. For example, a non-transitory computer-readable medium (e.g., memory 430 and/or storage component 440) may store a set of instructions (e.g., one or more instructions, code, software code, program code, and/or the like) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
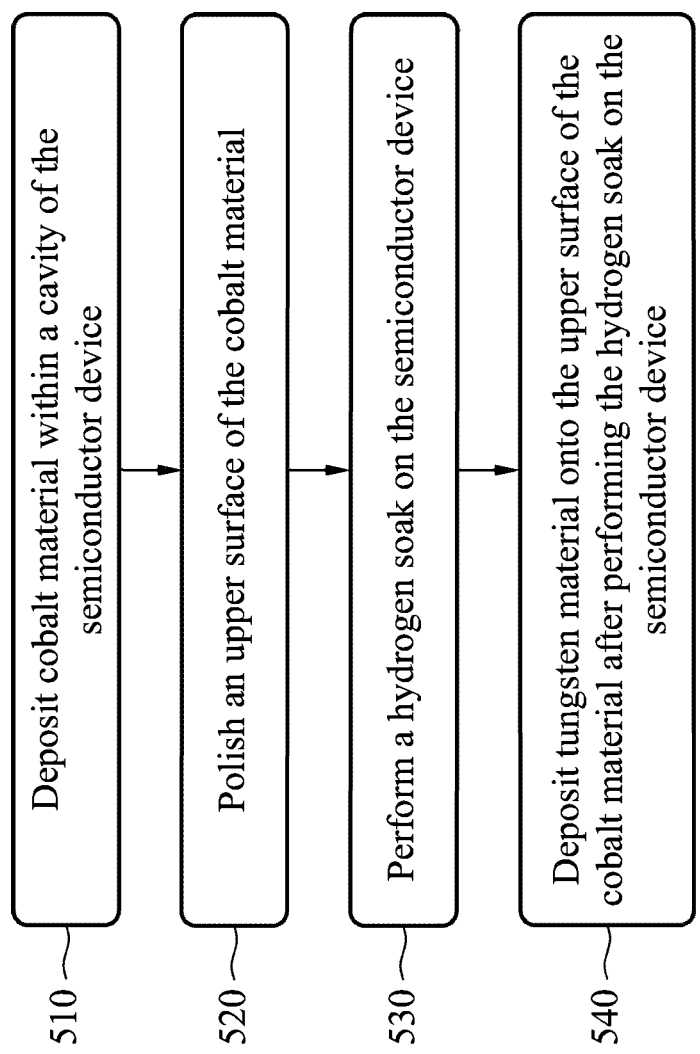
FIGS. 5 and 6 are flowcharts of examples of tungsten deposition on a cobalt surface.

FIG. 5 is a flowchart of an example process 500 associated with tungsten deposition on a cobalt surface. In some implementations, one or more process blocks of FIG. 5 may be performed by one or more semiconductor processing tools (e.g., deposition tool 102, soaking tool 104, CMP tool 106, etching tool 108, and/or wafer/die transport device 110). Additionally, or alternatively, one or more process blocks of FIG. 5 may be performed by one or more components of device 400, such as processor 420, memory 430, storage component 440, input component 450, output component 460, and/or communication interface 470.

As shown in FIG. 5, process 500 may include depositing cobalt material within a cavity of the semiconductor device (block 510). For example, the one or more semiconductor processing tools (e.g., deposition tool 102, soaking tool 104, CMP tool 106, etching tool 108, and/or other the like) may deposit cobalt material 210 within a cavity 202 of the semiconductor device 300, as described above.

As further shown in FIG. 5, process 500 may include polishing an upper surface of the cobalt material (block 520). For example, the one or more semiconductor processing tools (e.g., deposition tool 102, soaking tool 104, CMP tool 106, etching tool 108, and/or other the like) may polish an upper surface of the cobalt material 210, as described above.

As further shown in FIG. 5, process 500 may include performing a hydrogen soak on the semiconductor device (block 530). For example, the one or more semiconductor processing tools (e.g., deposition tool 102, soaking tool 104, CMP tool 106, etching tool 108, and/or other the like) may perform a hydrogen soak (e.g., as shown by FIG. 2D) on the semiconductor device 300, as described above.

As further shown in FIG. 5, process 500 may include depositing tungsten material onto the upper surface of the cobalt material (block 540). For example, the one or more semiconductor processing tools (e.g., deposition tool 102, soaking tool 104, CMP tool 106, etching tool 108, and/or other the like) may deposit tungsten material 216 onto the upper surface of the cobalt material 210 after performing the hydrogen soak on the semiconductor device 300, as described above.

Process 500 may include additional implementations, such as any single implementation or any combination of implementations described below and/or in connection with one or more other processes described elsewhere herein.

In a first implementation, performing the hydrogen soak comprises applying, before depositing the tungsten material, hydrogen gas to the semiconductor device.

In a second implementation, alone or in combination with the first implementation, applying the hydrogen gas to the semiconductor device comprises applying the hydrogen gas for at least 180 seconds.

In a third implementation, alone or in combination with one or more of the first and second implementations, after performing the hydrogen soak, greater than 50% of the cobalt material is in a hexagonal close-packed phase.

In a fourth implementation, alone or in combination with one or more of the first through third implementations, at least about 55% of the cobalt material is in the hexagonal close-packed phase.

In a fifth implementation, alone or in combination with one or more of the first through fourth implementations, a resistivity between the cobalt material and the tungsten material is less than about 400 ohms.

In a sixth implementation, alone or in combination with one or more of the first through fifth implementations, process 500 includes depositing, before depositing the cobalt material within the cavity, a titanium-based material within the cavity, wherein the titanium-based material adheres the cobalt material within the cavity.

In a seventh implementation, alone or in combination with one or more of the first through sixth implementations, the hydrogen soak prevents or reduces nitrogen bonding to the upper surface of the cobalt material before deposition of the tungsten material.

In an eighth implementation, alone or in combination with one or more of the first through seventh implementations, the hydrogen soak removes one or more of oxygen or nitrogen molecules from the upper surface of the cobalt material.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
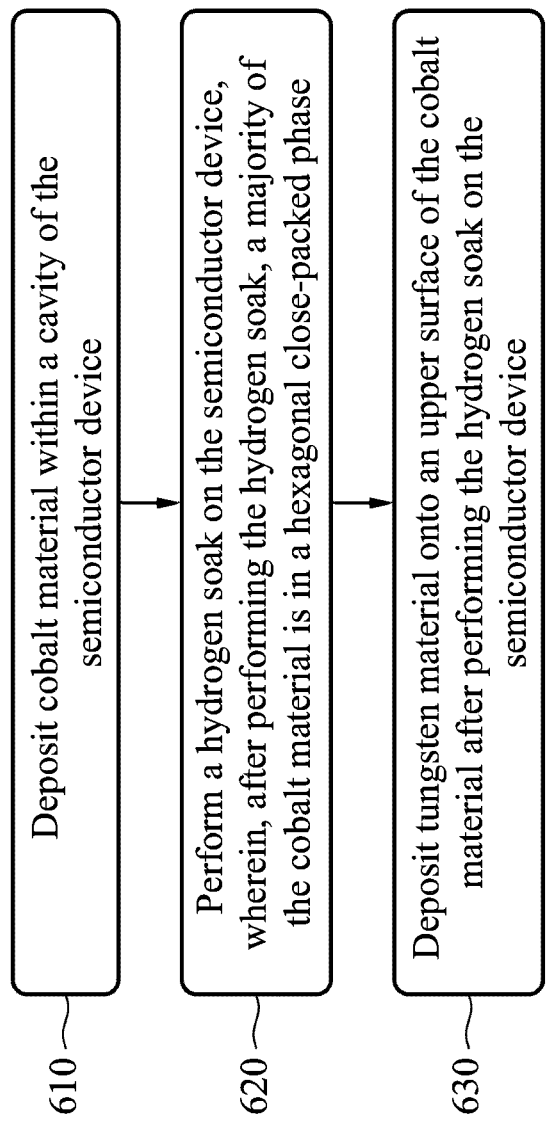

FIG. 6 is a flowchart of an example process 600 associated with tungsten deposition on a cobalt surface. In some implementations, one or more process blocks of FIG. 6 may be performed by one or more semiconductor processing tools (e.g., deposition tool 102, soaking tool 104, CMP tool 106, etching tool 108, and/or wafer/die transport device 110). Additionally, or alternatively, one or more process blocks of FIG. 6 may be performed by one or more components of device 400, such as processor 420, memory 430, storage component 440, input component 450, output component 460, and/or communication interface 470.

As shown in FIG. 6, process 600 may include depositing cobalt material within a cavity of the semiconductor device (block 610). For example, the one or more semiconductor processing tools (e.g., deposition tool 102, soaking tool 104, CMP tool 106, etching tool 108, and/or other the like) may deposit cobalt material 210 within a cavity 202 of the semiconductor device 300, as described above.

As further shown in FIG. 6, process 600 may include performing a hydrogen soak on the semiconductor device, wherein, after performing the hydrogen soak, greater than 50% of the cobalt material is in a hexagonal close-packed phase (block 620). For example, the one or more semiconductor processing tools may perform a hydrogen soak (as shown in FIG. 2D) on the semiconductor device 300, wherein, after performing the hydrogen soak, greater than 50% of the cobalt material is in a hexagonal close-packed phase, as described above.

As further shown in FIG. 6, process 600 may include depositing tungsten material onto an upper surface of the cobalt material (block 630). For example, the one or more semiconductor processing tools (e.g., deposition tool 102, soaking tool 104, CMP tool 106, etching tool 108, and/or other the like) may deposit tungsten material 216 onto an upper surface of the cobalt material 210 after performing the hydrogen soak on the semiconductor device 300, as described above.

Process 600 may include additional implementations, such as any single implementation or any combination of implementations described below and/or in connection with one or more other processes described elsewhere herein.

In a first implementation, performing the hydrogen soak comprises applying, before depositing the tungsten material, hydrogen gas to the semiconductor device.

In a second implementation, alone or in combination with the first implementation, applying the hydrogen gas to the semiconductor device comprises applying the hydrogen gas for at least about 180 seconds.

In a third implementation, alone or in combination with one or more of the first and second implementations, a resistivity between the cobalt material and the tungsten material is less than about 200 ohms.

In a fourth implementation, alone or in combination with one or more of the first through third implementations, process 600 includes performing, before performing the hydrogen soak, a chemical-mechanical polishing process on the cobalt material.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Based on performing the hydrogen soak before depositing the tungsten via, a resistivity between cobalt material (e.g., a cobalt-based contact plug) and tungsten material (e.g., a tungsten via) may be reduced, which may reduce an amount of a voltage drop across the tungsten via 216 and the cobalt-based contact plug 212 and/or reduce an amount of power consumed when operating the semiconductor device.

As described in greater detail above, some implementations described herein provide a semiconductor device and one or more methods for forming a tungsten via of a semiconductor device by depositing tungsten material on a cobalt surface after performing a hydrogen soak.

In some implementations, a method of forming a tungsten via of a semiconductor device includes depositing cobalt material within a cavity of the semiconductor device and polishing an upper surface of the cobalt material. The method further includes performing a hydrogen soak on the semiconductor device before depositing tungsten material onto the upper surface of the cobalt material.

In some implementations, a method of forming a tungsten via of a semiconductor device includes depositing cobalt material within a cavity of the semiconductor device. The method additionally includes performing a hydrogen soak on the semiconductor device such that, after performing the hydrogen soak, greater than 50% of the cobalt material is in a hexagonal close-packed phase. The method further includes depositing tungsten material onto an upper surface of the cobalt material.

In some implementations, a semiconductor device includes a cobalt-based contact plug within a cavity of the semiconductor device. Greater than 50% of cobalt material of the cobalt-based contact plug is in a hexagonal closed-packed phase. The semiconductor device also includes a tungsten via disposed on an upper surface of the cobalt-based contact plug. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a layer of titanium-based material within a cavity of the semiconductor device,
wherein an upper surface of the semiconductor device is free from the layer of titanium-based material, and
wherein the layer of titanium-based material comprises:

a first sublayer of material comprising titanium and silicon, a second sublayer of material comprising titanium, silicon, and nitrogen, wherein the second sublayer of material resides entirely over, and is in direct contact with, a top portion of the first sublayer of material, and a third sublayer of material comprising titanium and nitrogen, wherein the third sublayer resides above, and is in direct contact with the second sublayer of material;

a cobalt-based contact plug within the cavity of the semiconductor device and on an upper surface of the layer of titanium-based material, wherein a greater than 50% of cobalt material of the cobalt-based contact plug is in a hexagonal closed-packed phase; and a tungsten via on an upper surface of the cobalt-based contact plug, wherein the tungsten via is in direct contact with, and entirely within, an inner surface of the third sublayer of material of the layer of titanium-based material.

2. The semiconductor device of claim 1, wherein the cobalt-based contact plug has a width in a range from approximately 10 nanometers to approximately 20 nanometers and a depth in a range from approximately 35 nanometers to approximately 50 nanometers.

3. The semiconductor device of claim 1, wherein the tungsten via has a width in a range from approximately 11 nanometers to approximately 17 nanometers and a depth in a range from approximately 12 nanometers to approximately 35 nanometers.

4. The semiconductor device of claim 1, wherein a resistivity between the cobalt-based contact plug and the tungsten via is less than about 400 ohms.

5. The semiconductor device of claim 1, wherein the layer of titanium-based material is on a lower surface of the cobalt-based contact plug.

6. The semiconductor device of claim 1, wherein a width of the tungsten via is less than a width of the cobalt-based contact plug.

7. The semiconductor device of claim 1, wherein the second sublayer of material is also in direct contact with a portion of the cavity.

8. A semiconductor device, comprising:
a layer of titanium-based material within a cavity of the semiconductor device,
wherein an upper surface of the semiconductor device is free from the layer of titanium-based material, and
wherein the layer of titanium-based material comprises:
a first sublayer of material comprising titanium and silicon,
a second sublayer of material comprising titanium, silicon, and nitrogen, wherein the second sublayer of material resides above, and is in direct contact with, the first sublayer of material, and
a third sublayer of material comprising titanium and nitrogen, wherein the third sublayer resides entirely over, and is in direct contact with, the second sublayer of material;
a cobalt-based contact plug within the cavity and on an upper surface of the layer of titanium-based material; and
a tungsten via on an upper surface of the cobalt-based contact plug, wherein the tungsten via is in direct contact with, and entirely within, an inner surface of the third sublayer of material of the layer of titanium-based material.

9. The semiconductor device of claim 8, wherein at least one of:
the cobalt-based contact plug has a width in a range from approximately 10 nanometers to approximately 20 nanometers and a depth in a range from approximately 35 nanometers to approximately 50 nanometers, or
the tungsten via has a width in a range from approximately 11 nanometers to approximately 17 nanometers and a depth in a range from approximately 12 nanometers to approximately 35 nanometers.

10. The semiconductor device of claim 8, wherein a resistivity between the cobalt-based contact plug and the tungsten via is less than about 400 ohms.

11. The semiconductor device of claim 8, wherein the layer of titanium-based material is on a lower surface of the cobalt-based contact plug.

12. The semiconductor device of claim 8, wherein a width of the tungsten via is less than a width of the cobalt-based contact plug.

13. The semiconductor device of claim 8, wherein the second sublayer of material is also in direct contact with a portion of the cavity.

14. A semiconductor device, comprising:
a layer of titanium-based material within a cavity of the semiconductor device,
wherein an upper surface of the semiconductor device is free from the layer of titanium-based material, and
wherein the layer of titanium-based material comprises:
a first sublayer of material comprising titanium and silicon,
a second sublayer of material comprising titanium, silicon, and nitrogen, wherein the second sublayer of material resides above, and is in direct contact with, the first sublayer of material, and
a third sublayer of material comprising titanium and nitrogen, wherein the third sublayer resides entirely over, and is in direct contact with, a top portion of the second sublayer of material;
a cobalt-based contact plug within the cavity of the semiconductor device and on an upper surface of the layer of titanium-based material; and
a tungsten via disposed on the cobalt-based contact plug, wherein the tungsten via is in direct contact with, and entirely within, an inner surface of the third sublayer of material of the layer of titanium-based material.

15. The semiconductor device of claim 14, wherein at least one of:
the cobalt-based contact plug has a width in a range from approximately 10 nanometers to approximately 20 nanometers and a depth in a range from approximately 35 nanometers to approximately 50 nanometers, or
the tungsten via has a width in a range from approximately 11 nanometers to approximately 17 nanometers and a depth in a range from approximately 12 nanometers to approximately 35 nanometers.

16. The semiconductor device of claim 14, wherein the tungsten via is disposed on an upper surface of the cobalt-based contact plug, and wherein a resistivity between the cobalt-based contact plug and the tungsten via is less than about 400 ohms.

17. The semiconductor device of claim 14, wherein the layer of titanium-based material is on a lower surface of the cobalt-based contact plug, and wherein the layer of titanium-based material comprises one or more sub-layers of titanium-based material.

18. The semiconductor device of claim 14, wherein a width of the tungsten via is less than a width of the cobalt-based contact plug.

19. The semiconductor device of claim 14, wherein a greater than 50% of cobalt material of the cobalt-based contact plug is in a hexagonal closed-packed phase.

20. The semiconductor device of claim 14, wherein the second sublayer of material is also in direct contact with a portion of the cavity.

* * * * *